(12) United States Patent
Frojdh et al.

(10) Patent No.: US 7,065,119 B2
(45) Date of Patent: Jun. 20, 2006

(54) DISTRIBUTED FEEDBACK LASER WITH VARYING ELECTRICAL RESISTANCE FOR UNIFORM GAIN INSIDE THE OPTICAL WAVEGUIDE

(75) Inventors: Krister Frojdh, Alvsjo (SE); Per Granestrand, Tyreso (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 371 days.

(21) Appl. No.: 10/433,658

(22) PCT Filed: Dec. 13, 2001

(86) PCT No.: PCT/SE01/02767
§ 371 (c)(1),
(2), (4) Date: Jul. 17, 2003

(87) PCT Pub. No.: WO02/49173
PCT Pub. Date: Jun. 20, 2002

(65) Prior Publication Data
US 2004/0076207 A1    Apr. 22, 2004

(30) Foreign Application Priority Data
Dec. 13, 2000  (SE) ................... 0004613

(51) Int. Cl.
*H01S 5/00* (2006.01)
*H01S 3/97* (2006.01)
*H01S 3/08* (2006.01)

(52) U.S. Cl. ................ 372/50.1; 372/87; 372/96

(58) Field of Classification Search ........... 372/96, 372/50.1, 87
See application file for complete search history.

(56) References Cited

U.S. PATENT DOCUMENTS

| | | | |
|---|---|---|---|
| 4,751,719 A * | 6/1988 | Mito et al. ............. | 372/96 |
| 4,932,034 A * | 6/1990 | Usami et al. ........... | 372/96 |
| 5,321,716 A | 6/1994 | Kinoshita et al. ....... | 372/96 |
| 5,347,526 A | 9/1994 | Suzuki et al. .......... | 372/20 |
| 5,358,898 A | 10/1994 | Ogita et al. ............ | 438/32 |
| 6,567,446 B1 * | 5/2003 | Huang et al. ........... | 372/46.01 |

FOREIGN PATENT DOCUMENTS

EP    0332453 A2    9/1989

* cited by examiner

*Primary Examiner*—James Menefee
(74) *Attorney, Agent, or Firm*—Nixon & Vanderhye P.C.

(57) ABSTRACT

An electrooptic device (1) such as a distributed feed back semiconductor laser or a semiconductor modulator comprises an optical waveguide. A contact layer (11) is applied to the optical waveguide for conducting electrical current to the device for driving or modulating it. The contact layer is connected to the end of an electrically conducting path (3) and can have a shape, as seen perpendicularly to the surface of the device, to give an electric resistance between the end of the path and different areas at the optical waveguide which resistance is higher for areas located close to the ends of the device than for areas are located at the central region of the device. The shape can be si-milar to a trapezium having concave oblique sides and is selected so that the resulting varying electrical resistance gives a sub-stantially uniform electrical power or gain inside the optical waveguide, taken in the longitudinal direction of the waveguide.

21 Claims, 1 Drawing Sheet

1

DISTRIBUTED FEEDBACK LASER WITH VARYING ELECTRICAL RESISTANCE FOR UNIFORM GAIN INSIDE THE OPTICAL WAVEGUIDE

TECHNICAL FIELD

The present invention relates to a distributed feedback (DFB) semiconductor laser.

BACKGROUND

Distributed feedback semiconductor lasers are currently typically used as sources of light for high performance, high speed and long distance transmission of signals on single mode optical fibers in optical communication networks.

DFB lasers comprise various semiconductor layers forming an optical waveguide including an active layer/active layers and they also comprise a grating. The design of the grating is critical to obtain good performance. An important parameter of such lasers is the product $\kappa L$, where $\kappa$ is the strength of the Crating and L is the length of the waveguide. A high value of this product will reduce the threshold current and improve the speed of the laser. If integrated arrays of DFB lasers are manufactured, there should be a high yield in the manufacture of the optical array chips. This can be obtained by applying antireflection (AR) coatings on the two facets at the opposite ends of the waveguide of the laser. However, when the optical power emitted by the laser is increased, problems with mode hopping in the laser can occur. This is particularly a problem for lasers having high values of the product $\kappa L$ and/or having both end facets AR coated. The main reason thereof resides in the uneven power distribution inside the laser. There is a small scale varying power distribution caused by the standing wave pattern of light inside the laser. There is also a larger scale variation of power over the length of the waveguide including that the power typically decreases considerably when approaching the opposite end of the waveguide, as taken from a starting point at the center of the laser waveguide. Both the non-uniform small scale power distribution and the large scale power distribution increase the gain for unwanted optical modes of the light generated in the laser.

The uneven large scale power distribution can in more detail be described in the following way. The lower optical power at the opposite ends of the laser waveguide or laser cavity results in a lower rate of stimulated recombination and, owing to electrical resistance in contact layers and to effects associated with carrier transport, in a higher carrier density and hence in a higher gain as compared to the central region of the waveguide. The higher gain at the end regions in turn results in a higher gain also for unwanted optical modes. Another adverse effect comprises that a variation of gain results in a variation of the refractive index and thereby results in a variation of the Bragg-wavelength along the laser waveguide. This in turn reduces the suppression of the unwanted optical modes and increases the linewidth of the laser. A method of reducing these problems involves the use of a "complex coupled" grating designed to give a periodic variation of the gain or loss along the laser waveguide. However, it is difficult to fabricate such complex coupled gratings. They also typically increase both the threshold current and the losses inside the DFB laser.

In U.S. Pat. No. 5,321,716 for Kinoshita et al., assigned to KK Toshiba, a distributed feedback semiconductor laser having a controlled phase shift is disclosed. A doped semiconductor, ohmic contact layer has an electrical resistance which in a central phase shift region can be higher or lower than in the end regions.

SUMMARY

It is an object of the invention to provide a DFB having a substantially uniform large scale distribution of gain and power along its waveguide.

Generally thus, in order to avoid the non-uniform large scale distribution of gain and power along the waveguide of a DFB semiconductor laser or other similar device, a varied resistance is used in the laser, the resistance varying in the longitudinal direction of the laser waveguide or cavity. In particular, the resistance is varied in such a way the electrical resistance is higher at the opposite ends of the laser waveguide. The electrical resistance is selected to make the electrical power or gain inside the optical waveguide uniform in the longitudinal direction thereof.

The varying resistance is obtained by a contact layer for conducting electrical current to or from the device. The contact layer can be patterned or given a selected shape as seen from above. The contact layer extends over all of the optical waveguide up to the two opposite ends thereof and can have a substantially uniform thickness. The configuration or pattern in the plane of the electrically conducting layer is selected to give an electric resistance, between a middle connection region of the layer and areas at the optical waveguide, which is higher for those areas located close to the opposite ends than for those areas located at the central region. The configuration or pattern of the contact layer can be substantially triangular or have the shape of a trapezium and can comprise two opposite sides extending from the opposite ends of the waveguide, the opposite sides being concave and/or forming acute angles to the longitudinal direction.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

Figure 1:
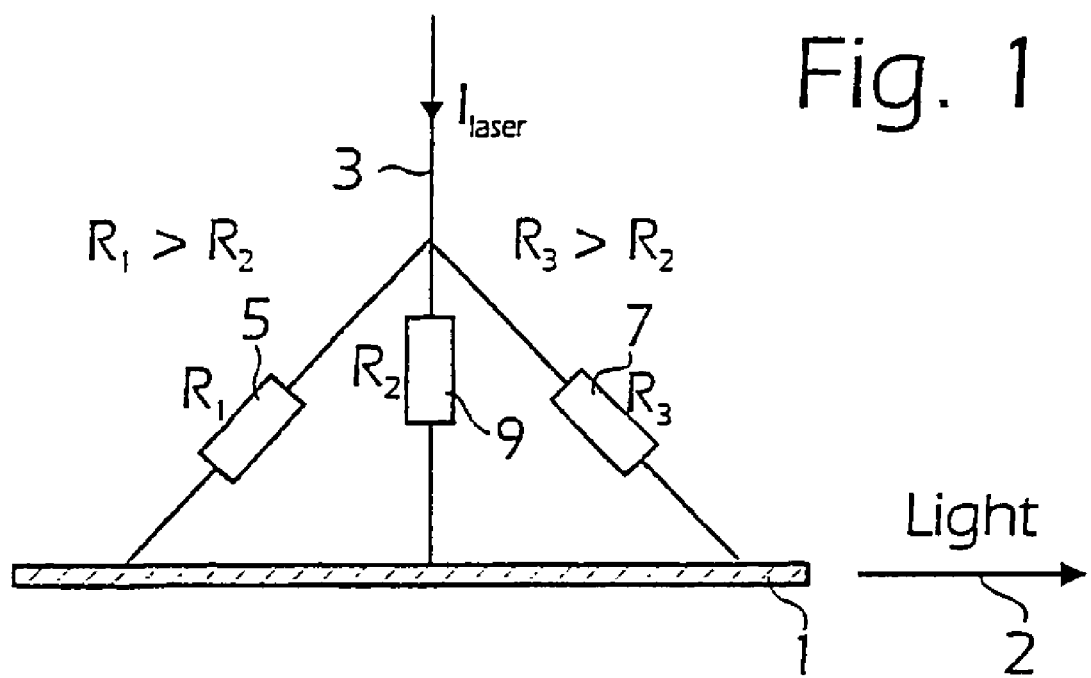
FIG. 1 is a diagram illustrating a principle of electrically connecting a DFB laser through an ohmic contact layer designed to give a more uniform large scale distribution of gain along the laser than in a laser having a simple, connected ohmic contact layer of uniform thickness.

In the schematic picture in FIG. 1 a DFB semiconductor laser is shown at 1 comprising active layers, not shown, forming together with surrounding layers an optical waveguide, and further comprising a grating, not shown. The laser is basically an elongated plate having a longitudinal direction in the plane of the paper in which also light is emitted, see the arrow 2. The laser 1 is connected to an input electrical conductor path 3 feeding electrical current $I_{laser}$ to the laser for driving it to emit light. The conductor path 3 has a multitude of branches feeding separate regions of the laser, the contact layer, not shown, of the laser thus being divided into separated fields which are not in electrical contact with each other laterally, i.e. in the plane of the contact layer. In the embodiment shown there are three branches, two of which are connected to the opposite end regions of the laser and one of which is connected to a central region of the laser. In each of the branches resistors are connected having selected resistances. Thus, in the branches to the end regions resistors 5, 7 are connected having resistances $R_1$ and $R_3$ respectively. In the central branch a resistor 9 is connected having a resistance $R_2$. In order to reduce the non-uniformity of the large scale power distribution in the laser or of the gain in the laser the resistors are selected to give higher electrical resistances to paths connected to regions at the opposite ends of the laser and lower resistances to paths connected to more centrally located regions, the resistance values thus increasing at either direction from the central region. Thus, in FIG. 1 the resistors 5, 7, 9 are selected to give higher resistances in the paths to the end regions. That is, the conditions $R_1 > R_2$, $R_3 > R_2$ are fulfilled.

Figure 2:
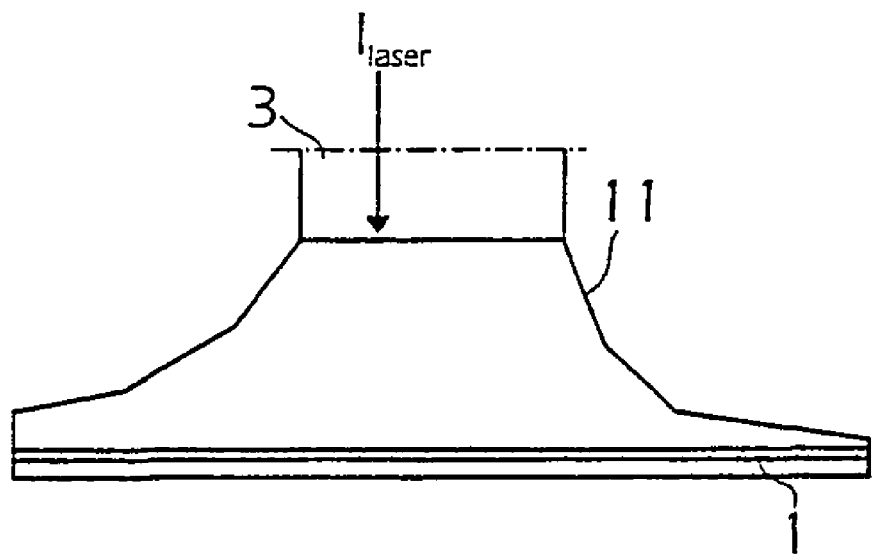
FIG. 2 is a schematic view from above of a DFB semiconductor laser having an ohmic contact layer patterned to give a more uniform large scale distribution of gain along the laser.

In another embodiment illustrated by the view from above in FIG. 2 the contact layer of the laser body 1 has a substantially uniform thickness and a controlled, substantially uniform electrical resistivity. The contact layer has been patterned to give an electrical connection area 11 in which different resistances in the electrical conduction paths from the input conduction path 3 to the different portions of the laser 1 exist in order to accomplish an electrical connection somewhat similar to that shown in FIG. 1. The input conduction path 3 extends substantially perpendicularly to the longitudinal direction of the laser intersecting the longitudinal axis of the laser at some place within the laser and also the edges of the conduction path intersect the laser within the body thereof. Thus, the width of the input conduction path is smaller than the length of the laser. The connection area thus obtains a substantially triangular shape or a fan-out shape as seen from the input conduction path. As seen in FIG. 2, it can more particularly have substantially a trapezium shape. The oblique sides of the trapezium can be curved lines, concavely shaped to give the desired varying resistance. The shape can also be described as the width of the connection area 11, taken in directions perpendicular to the longitudinal axis of the laser being gradually reduced when approaching the ends of the laser when starting from some point close to the center of the laser. Such a shape will give a resistance varying in the desired way.

The power distribution inside the laser 1, located beneath the contact layer 11, can be calculated using known methods. The optimal geometry of the contact layer 11 can then be determined from the calculated power distribution, the gain characteristics of the laser and the resistivity of the material of the contact layer. Thus the following steps can be performed:

1. Calculating the power distribution P(z) inside the laser assuming a uniform gain for the operating power of the laser, z being a coordinate value taken along a coordinate axis extending in the longitudinal direction of the laser.
2. Calculating the stimulated recombination $n_{st}$ from the power distribution.
3. Calculating, from a measured or calculated gain curve, the electrical current density J(z) needed at this level of stimulated recombination and the gain.
4. Calculating the optimal voltage distribution V(z) along the contact layer 11 from the electrical current density and the contact resistance. In the contact resistance a phenomenological compensation for carrier transport effects can be included.
5. Calculating, from the voltage distribution and the sheet or area resistance or the electrical resistivity of the material of the contact layer and its thickness, the geometry of the contact layer to be used in the layout.

Lasers having contact layers with a varying width can be produced by only slightly changed standard processes used for fabricating DFB semiconductor lasers, the processes being modified to include a suitable choice of pad metallization and masks having the proper pad geometry.

The modified electrical connection of a contact layer or using a contact layer having a varying, adapted thickness can also be used to compensate for saturation effects in other semiconductor devices having a non-uniform power developed along its length, such as semiconductor modulators. This type of modulators are typically used as modulators integrated with DFB lasers.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

The invention claimed is:

1. An electrooptic device including an optical waveguide having a longitudinal direction, two opposite ends and a central region, a region of an electrically conducting layer forming a contact layer applied to the length of the optical waveguide for conducting electrical current to the electrooptic device for driving it, wherein the contact layer extends over the optical waveguide up to said two opposite ends and has a substantially constant or uniform thickness, and the contact layer is connected to an electrically conducting path at a connection region and has a configuration or pattern in the plane of the electrically conducting layer to give an electric resistance between the connection region and areas at the optical waveguide which is higher for those of the areas which are located close to said two opposite ends than for those of the areas which are located at said central region, so that the contact layer has an electrical resistance varying in the longitudinal direction, the varying electrical resistance adapted to make the electrical power developed in or the gain inside the optical waveguide constant or uniform in the longitudinal direction.

2. The electrooptic device of claim 1, where the electrooptic device is a distributed feed back semiconductor laser.

3. The electrooptic device of claim 1, where the electrooptic device is a semiconductor modulator.

4. The electrooptic device of claim 1, wherein the configuration or pattern of the contact layer includes two opposite sides extending from said two opposite ends, the two opposite sides forming acute angles to the longitudinal direction.

5. The electrooptic device of claim 4, wherein the two opposite sides have concave shapes, curved in a direction towards said central region.

6. The electrooptic device of claim 4, wherein the connection region has a longitudinal direction parallel to the longitudinal direction of the electrooptic device.

7. The electrooptic device of claim 4, wherein the configuration or pattern of the contact layer substantially corresponds to that of trapezium having two parallel sides and two oblique sides, a longer one of the two parallel sides substantially located at and corresponding to the optical waveguide of the electrooptic device and a shorter one of the two parallel sides located at the connection region.

8. The electrooptic device of claim 7, wherein the two oblique sides are located in acute angles to the longer one of the two parallel sides.

9. The electrooptic device of claim 1, wherein the contact layer has a portion located at and corresponding to the optical waveguide of the electrooptic device and a portion located at the connection region, the portion at the connection region being distinct from the portion located at and corresponding to the optical waveguide.

10. The electrooptic device of claim 9, wherein the portion at the connection region is, when looking in a direction parallel to the plane of the electrically conducting layer and perpendicular to the longitudinal direction, located in a position corresponding to a middle portion of the optical waveguide.

11. The electrooptic device of claim 1, wherein the length of the connection region, in the longitudinal direction, is smaller than the length of the optical waveguide.

12. The electrooptic device of claim 11, wherein said length of the connection region is smaller than half the length of the optical waveguide.

13. The electrooptic device of claim 11, wherein said length of the connection region is equal to substantially a third of the length of the optical waveguide.

14. The electrooptic device of claim 1, wherein the input conduction path is patterned in the electrically conducting layer and extends substantially perpendicularly to the longitudinal direction.

15. An electrooptic device comprising:

an optical waveguide having a longitudinal direction, two opposite ends, and a central region, an electrically conducting contact layer, connected to an electrical conductor at a connection interface and applied to a length of the optical waveguide including the two opposite ends, for conducting drive current provided by the electrical conductor to the electrooptic device, wherein the contact layer is substantially planar having a substantially constant or uniform thickness in that plane, and wherein the contact layer has a configuration or pattern in the plane of the contact layer, the configuration or pattern providing a higher electrical resistance between the connection interface and areas of the optical waveguide located close to the two opposite ends and a lower electrical resistance between the connection interface and an area located at or near the central region, wherein the higher and lower electrical resistances of the contact layer along the longitudinal direction are such that electrical power developed in or a gain inside the optical waveguide is substantially constant or uniform in the longitudinal direction.

16. The electrooptic device of claim 15, where the electrooptic device is a distributed feed back semiconductor laser or a semiconductor modulator.

17. The electrooptic device of claim 15, wherein the configuration or pattern of the contact layer includes two opposite sides extending from said two opposite ends, the two opposite sides forming acute angles to the longitudinal direction.

18. The electrooptic device of claim 15, wherein the two opposite sides have concave shapes, curved in a direction towards said central region.

19. The electrooptic device of claim 15, wherein the connection interface has a longitudinal direction parallel to the longitudinal direction of the electrooptic device.

20. The electrooptic device of claim 15, wherein the configuration or pattern of the contact layer substantially corresponds to that of trapezium having two parallel sides and two oblique sides, a longer one of the two parallel sides substantially located at and corresponding to the optical waveguide of the electrooptic device and a shorter one of the two parallel sides located at the connection interface.

21. The electrooptic device of claim 15, wherein the length of the connection interface, in the longitudinal direction, is smaller than the length of the optical waveguide.

* * * * *